United States Patent [19]

Finkl

[11] Patent Number: 5,439,531

[45] Date of Patent: Aug. 8, 1995

[54] METHOD AND SYSTEM FOR MAINTAINING THE EFFICIENCY OF PHOTO-VOLTAIC CELLS

[76] Inventor: Anthony W. Finkl, 445 E. Royal Flamingo Dr., Sarasota, Fla. 34236

[21] Appl. No.: 167,270

[22] Filed: Dec. 14, 1993

[51] Int. Cl.$^6$ .................. H01L 31/06; H01L 31/042
[52] U.S. Cl. .................. 136/243; 136/290; 136/293; 136/244
[58] Field of Search .............. 136/243–245, 136/251, 290–291, 293

[56] References Cited

U.S. PATENT DOCUMENTS 4,232,070  11/1980  Inouye et al. .................. 428/49

FOREIGN PATENT DOCUMENTS 4-127581  4/1992  Japan .................. 136/251

Primary Examiner—Aaron Weisstuch
Attorney, Agent, or Firm—Baker & McKenzie

[57] ABSTRACT

An inexpensive method of improving photo-voltaic cell efficiency through preventive maintenance. An electro-static generator places a constant electro-static charge upon the surface of a photo-voltaic cell, or its facial housing. This charge then repels small, unwanted dust and dirt particles. The system also includes an electrical circuit which not only monitors the charge being applied to the cell, but also discharges the electro-static charge when it becomes too great.

9 Claims, 1 Drawing Sheet

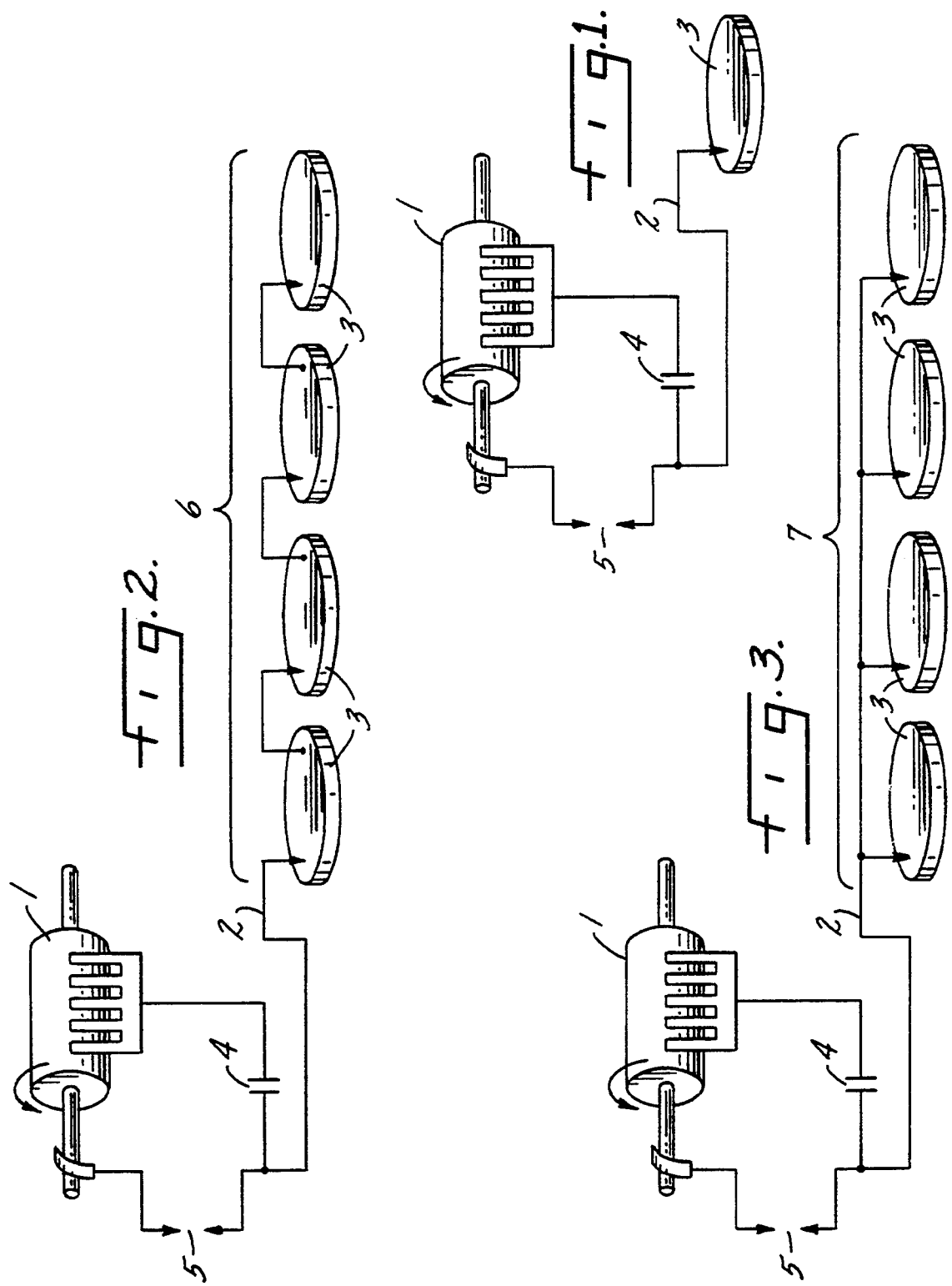

METHOD AND SYSTEM FOR MAINTAINING THE EFFICIENCY OF PHOTO-VOLTAIC CELLS

The present invention relates to methods of preventing undesirable matter from accumulating on the face of photo-voltaic cells so that the cells can maintain their maximum efficiency when converting solar energy into electrical energy.

BACKGROUND OF THE INVENTION

The basic functions of a photo-voltaic cell include the facial absorption of light rays and the subsequent conversion of these rays into electrical energy. Not surprisingly, the industry is constantly seeking ways to maximize the electrical output of photo-voltaic cells through either improved manufacturing procedures, cell design, or chemical treatment. Even so, photo-voltaic cells rarely operate at their normal rated efficiency levels because dust, dirt and other various materials collect on the face of these cells and impede the absorption process.

Photo-voltaic cells perform at peak efficiency only when their working surfaces remain free and clear from such particulate debris. However, while there is an abundance of prior art which seeks to increase photo-voltaic cell efficiency through new design techniques, the field of improved cell efficiency through post-manufacturing cell maintenance has remained relatively undeveloped.

The functional character of photo-voltaic cells requires that they, or their facial housings, be exposed not only to sunlight, but also to nature's elements. Dirt and dust particles can be expected to gradually accumulate on the cells' faces, considering everyday wind and rain factors. Accordingly, one might opt to clean the cells on a regular basis using human labor. This process might increase the cells' efficiency, but it would also prove to be a relatively expensive proposition if the cells are to be maintained frequently. Conversely, cleaning may be disregarded altogether; that is, until such time when the faces of the cells are so opaque that a washing is absolutely necessary. This method reduces labor costs, but does so only at the expense of the cells' operating efficiency.

There is a need in this field for a system of preventive maintenance whereby foreign matter would be deterred from collecting on the face of a photo-voltaic cell in the first place. Such a method would optimize a cell's absorption rate on a more continuous basis. At the same time, this system would greatly reduce the costs associated with periodic or constant cleaning.

SUMMARY OF THE INVENTION

Accordingly, the present invention provides a system which works constantly to repel undesirable dirt and dust particles away from the surface of a photo-voltaic cell. As a continuous force pushes this matter aside, the cell is allowed to absorb the maximum amount of light rays. This system is non labor-intensive and hence significantly reduces the need for periodic cleaning, and it permits photo-voltaic cells to be used in previously unserviceable areas.

The present invention includes both a static electricity generator and a means of placing this electro-static charge on a photo-voltaic cell(s), or its facial housing. This negative electrical charge is continuously applied to the face of the cell and repels any objects of low mass in the near vicinity; i.e., dirt and dust particles. To ensure that this charge does not damage the cell, this invention also includes a simple electrical circuit which both monitors and limits the buildup of this electrical charge.

The present invention distinguishes itself from the prior art by increasing photo-voltaic cell efficiency through preventive maintenance, rather than actual cell design. This proactive method of preventive cell maintenance is unique to the field, and it is far less expensive than the reactive process of cleaning dirty photo-voltaic cells.

It is therefore a general object of the present invention to increase the operating efficiency of photo-voltaic cells through a process of preventive maintenance.

More specifically, it is an object of the present invention to repel dust and dirt particles from the face of photo-voltaic cells, or their facial housings.

Another object of the present invention is to reduce or eliminate the need for periodic cleaning of photo-voltaic cells, or their facial housings.

In one of its aspects, it is an object of the present invention to deter birds from perching on the photo-voltaic cells, or their housings, and to reduce the dirtying effect of their droppings.

A related object of the present invention is to reduce the overall costs of general maintenance while simultaneously increasing the savings associated with improved cell conversion capacity.

Moreover, an additional object of the present invention is to allow the use of photo-voltaic cells in new areas that were previously deemed too remote or unserviceable.

Further objects and advantages of the invention will become apparent to those of ordinary skill in the pertinent art upon review of the following detailed description, accompanying drawings, and appended claims.

BRIEF DESCRIPTION OF THE DRAWINGS

FIG. 1 is a schematic representation of one embodiment of the invention, including a prototypical electro-static generator, a storage capacitor, an adjustable spark gap, and an electrical connection to the face of a single photo-voltaic cell.

FIG. 2 is a schematic representation identical to FIG. 1, including an electrical connection to the faces of multiple photo-voltaic cells arranged in a series electrical configuration.

FIG. 3 is a schematic representation identical to FIG. 1, including an electrical connection to the faces of multiple photo-voltaic cells arranged in a parallel electrical configuration.

DETAILED DESCRIPTION OF THE DRAWINGS

Turning first to FIG. 1, the method of the present invention comprises an electro-static generator 1, a means of transferring an electro-static charge 2, the surface or facial housing of a photo-voltaic cell 3, a storage capacitor 4, and an adjustable spark gap 5. The electro-static generator 1 is representative of numerous well-known mechanical machines that can generate an electro-static charge. The most recognized machine in the field is probably the Van de Graff Generator. However, the purpose of this invention is not to create another machine, but simply to implement the functional characteristics of an existing electro-static generator.

The electro-static generator 1 supplies a flow of electrons to both the means of transferring an electro-static charge 2 and the storage capacitor 4. In turn, the means for transferring an electro-static charge 2 places this charge on the surface or facial housing of a photo-voltaic cell 3. This static electrical charge serves to repel any objects of low mass in the near vicinity of the photo-voltaic cell.

This same static electrical charge would also help prevent birds from using the photo-voltaic cells as a perch. As a bird would come in contact with the surface or facial housing of the cell 3 it would receive a small non-damaging electrical shock. Since birds would be deterred from perching on the cells, both the accumulation of bird droppings and the subsequent cleaning of the cells would be greatly reduced.

The duration of the static charge is determined by the rate of leakage. This leakage depends upon the ambient humidity, the size and amount of particulate matter in the immediate area, and the corresponding charge induced or removed from the surface or facial housing of the photo-voltaic cell 3. Thus, in the present embodiment a static charge is generated by the electro-static generator 1 either continuously or at regular intervals in order to maintain the cells ability to repel surface contaminates.

The present invention is also concerned with preventing electrical damage to the surface of the cell. Referring once again to FIG. 1, as the electro-static generator 1 produces more and more electrons, an increased electro-static charge is stored in both the storage capacitor 4 and the surface or facial housing of the photo-voltaic cell 3. In the schematic illustrated, the adjustable spark gap 5 is set at a specific distance or "gap" to correspond to the desired maximum allowable electro-static charge. Once the storage capacitor 4 accumulates this maximum charge, the adjustable spark gap 5 discharges the electrons from both the storage capacitor 4 and the surface or facial housing of the photo-voltaic cell 3. This cycle is then repeated in order to keep a non-damaging, controlled electro-static charge on the cell which will continually repel small particulate matter.

Turning now to FIG. 2, the illustrated procedure demonstrates how the means for transferring an electro-static charge 2 may be connected to multiple surfaces or facial housings of photo-voltaic cells 3 in a series electrical configuration 6. Similarly, the schematic of FIG. 3 demonstrates how the means for transferring an electro-static charge 2 may be connected to multiple surfaces or facial housings of photo-voltaic cells 3 in a parallel electrical configuration 7. The schematics of FIGS. 2, and 3 reflect two features of the invention whereby a relatively large battery of photo-voltaic cells can be maintained from a single electro-static generator 1.

From the foregoing drawings and description, it will be apparent to those skilled in the pertinent art that variations may be made within the spirit and scope of the present invention. Accordingly, it is intended that the scope of the invention be limited solely by the scope of the hereafter appended claims and not by any specific wording in the foregoing description.

I claim:

1. In a method of maintaining the efficiency of terrestrial photo-voltaic cells, the steps of:
   (a) placing an electro-static charge on a surface of a terrestrial photo-voltaic cell(s) or its respective facial housing;
   (b) discharging said electro-static charge at a given maximum voltage.

2. The method as defined by claim 1,
   wherein said electro-static charge is provided by an electro-static generator.

3. The method as defined by claim 1,
   wherein said discharging of said electro-static charge is provided by an adjustable spark gap.

4. The method as defined by claim 1,
   wherein said maximum voltage is determined by an electrical storage capacitor.

5. The method as defined by claim 1,
   wherein said electro-static charge is applied to multiple photo-voltaic cells arranged in a series electrical configuration.

6. The method as defined by claim 1,
   wherein said electro-static charge is applied to multiple photo-voltaic cells arranged in a parallel electrical configuration.

7. In a method of maintaining the efficiency of terrestrial photo-voltaic cells, the steps of:
   (a) placing an electro-static charge from an electro-static generator on a surface of a terrestrial photo-voltaic cell(s) or its respective facial housing;
   (b) discharging said electro-static charge through an adjustable spark gap at a given maximum voltage determined by an electrical storage capacitor,
   wherein the adjustable spark gap and the electrical storage capacitor are electrically connected in series with said electro-static generator.

8. The method as defined by claim 7,
   wherein said electro-static charge is applied to multiple photo-voltaic cells arranged in a series electrical configuration.

9. The method as defined by claim 7,
   wherein said electro-static charge is applied to multiple photo-voltaic cells arranged in a parallel electrical configuration.

* * * * *